Nov. 20, 1962 H. J. CALDERHEAD 3,065,434

FILTER

Filed Oct. 2, 1959

2 Sheets-Sheet 1

INVENTOR.
HENRY J. CALDERHEAD

BY Bosworth, Sessions,
Herrstrom and Knowles
ATTORNEYS.

Nov. 20, 1962 H. J. CALDERHEAD 3,065,434

FILTER

Filed Oct. 2, 1959 2 Sheets-Sheet 2

INVENTOR.
HENRY J. CALDERHEAD
BY Bosworth, Sessions, Herrstrom and Knowles
ATTORNEYS.

United States Patent Office 3,065,434

Patented Nov. 20, 1962

3,065,434
FILTER

Henry J. Calderhead, Euclid, Ohio, assignor to Bird Electronic Corporation, Solon, Ohio, a corporation of Ohio Filed Oct. 2, 1959, Ser. No. 844,121
27 Claims. (Cl. 333—70)

This invention relates to electric wave filters, and is particularly directed to low pass or band pass filters employing coaxial lines, capacitors, and coils as circuit elements.

At frequencies ranging upward from about 50 megacycles per second, it becomes increasingly difficult to use electric wave filters consisting in the conventional manner of lumped constant circuit elements. This is true particularly in resonant circuits where a high "Q" is required. Conventional inductance and capacitance elements usually fail to behave as they do at lower frequencies; mutual impedances between filter branches become significant, and often even the leads connecting the parts of the filter develop undesired reactances of high magnitudes. Factors such as these in filters having conventional structural arrangements of components often cause leakage or crosstalk between the input and output terminals or other parts of such filters, thus defeating the purpose of the filter to reject or attenuate undesired signals.

In general, filters of the type to which the invention pertains are employed in complex apparatus, where space and weight often are at a premium. Therefore, the units usually must be as small and light as possible, particularly for aircraft apparatus. These factors increase the tendencies toward breakdown of dielectrics, arcing and other undesirable inter-effects, such as those mentioned above, among components of the filter which must be closely positioned in compact relationship.

Problems also exist in the manufacture of such filters. In order to have the desired accurate cut-off and satisfactory transmission characteristics, the filter units and parts thereof must be accurately and precisely manufactured and assembled. Assembly of small parts in close, precise relationship adds substantially to the cost when the unit is to be made small, compact and light. Yet it is important that such filters be produced at as low a cost as possible, and have low pass band insertion losses, low voltage standing wave ratios, and high stop or reject band attenuation, with a minimum of coupling, leakage crosstalk, or other reactions between the components of the filter.

It is an object of this invention to provide a low pass or band pass filter which satisfies the above desiderata and is low in weight and extremely compact, but which nevertheless can be precision manufactured and assembled at low costs.

It is a further object of this invention to provide such a filter which is not only externally shielded, but also internally shielded into a plurality of compartments, in which the filter components are so located and positioned relative to each other and to such compartments that undesired coupling, leakages, crosstalk or other similar effects are substantially or completely eliminated.

As an additional object and further refinement, the invention provides a filter comprising an elongated housing formed of conductive material in which are longitudinally disposed two coaxial line elements or sets of such elements, the input end or ends of one element or set being directed toward and connected to an input element or terminal fitting of the filter at one end of the housing, while the input end or ends of the other coaxial line element or set is directed toward and connected to an output element or terminal fitting at the other end of the housing, the housing being subdivided by spaced partition means, preferably supporting capacitors. Each of the resulting end compartments of the housing contains an input or output terminal fitting, the input end or ends of one coaxial line element or set, and one or more inductance coils connected in series to the terminal fitting, to the center conductor or conductors of the coaxial line element or set of such elements and to a capacitor.

In a still more specialized version of the invention, and as an additional objective, the partition means is formed with an opening or window through which electrical connections are made from one end compartment to the other, such window being fitted with a capacitor connected between the partition means and the through connection. According to a preferred variation of this aspect of the invention, the partition means also comprises a pair of spaced partition elements which provide a central compartment in addition to and intermediate the end compartments; each partition element is windowed and the intermediate compartment contains inductance coil means connected to capacitors mounted across such windows. Since the components of the filter thus are spaced and effectively shielded, undesired interreactions between filter components are kept to a minimum or eliminated despite the very compact structure.

As another object and further refinement of the structural combination, all components of the assemblage, other than the input and output terminals mounted at the ends of the housing, may be preassembled outside of and apart from the housing in a rigid, compact, lightweight preassembly, more particularly comprising a trough or cradle preferably of metal including the partition means mentioned above and carrying components of the filter so that ready access is obtained to substantially all portions of all components for rapid and easy positioning, assembling, soldering etc., this feature being particularly advantageous when the parts are small. The preassembly is easily snapped or sprung into predetermined position in the housing, the unit preassembly, preferably the cradle thereof, having means adapted to cooperate with locating and locking means on the housing; soldered connections to the conductors of the input and output terminal fittings complete the electrical circuit and a suitable lid for the housing completes the assembly.

Other objects and advantages relate to certain novel features of construction and combinations of parts apparent in the following detailed description of a preferred embodiment which represents the best known mode of practicing the invention. This description is made with reference to the accompanying drawings forming a part of the specification.

Figures 1, 2, 3, 4, 5:
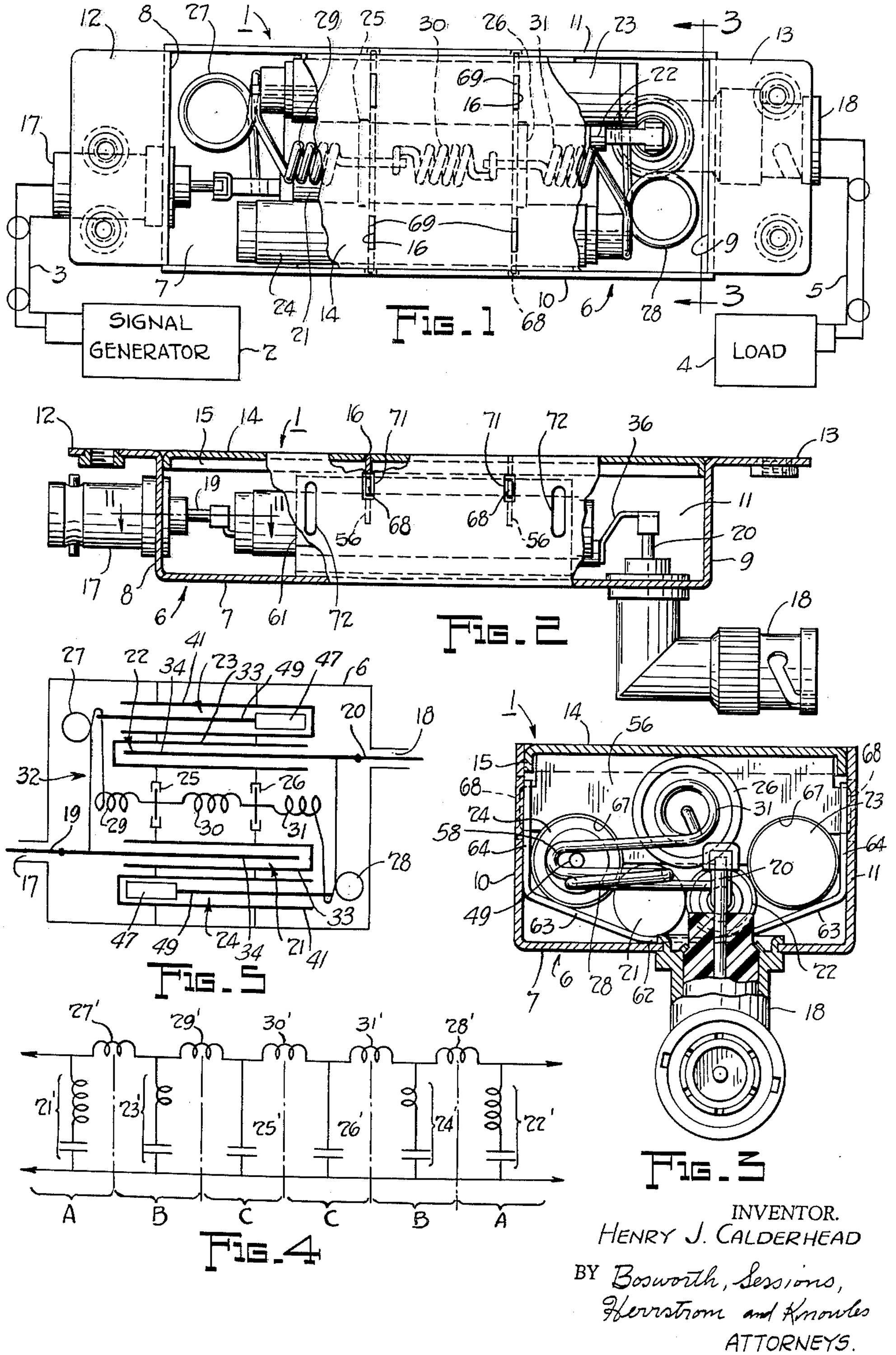
FIGURE 1 is a partly diagrammatic plan view of a coaxial line circuit which includes a low pass filter embodying the invention, the lid being partially broken away to show the interior of the housing, and a part of the housing being broken away to show the connection of one of the partitions to a housing wall.
FIGURE 2 is a side elevational view to the same scale, of the filter, parts of the housing being broken away to show the connections of the interior parts to the input and output terminal fittings.
FIGURE 3 is a sectional elevation, along line 3—3 of FIGURE 1.
FIGURE 4 is an equivalent lumped constant circuit diagram of the illustrated filter.
FIGURE 5 is a diagrammatic view, with the filter elements in exploded relation, showing the electrical connections of the components.

In FIGURE 1, the filter constituting a preferred embodiment of the invention is indicated generally at 1. It is shown as connected at its input end to a signal generator 2 by a coaxial transmission line 3 both being diagrammatically indicated, and to a load 4 by a coaxial transmission line both being diagrammatically shown.

As shown in FIGURES 1, 2, and 3, filter 1 comprises an elongated open-topped rectangular box-like housing 6 formed of suitable electrically conductive material such as sheet brass having bottom wall 7, end walls 8 and 9, side walls 10 and 11, and apertured supporting flanges 12 and 13. Lid 14, having flanged edges 15 and slots 16, is adapted to be fitted into the open top of housing 6 to close it.

An input terminal fitting 17 comprising inner pin and outer tubular conductors and adapted to be connected to a coaxial transmission line such as line 3 from the signal generator 2 is mounted at one end of the housing 6 in one of the walls such as end wall 8. An output terminal fitting 18 similarly constructed to the input terminal fitting 17 and adapted to be connected to a coaxial transmission line such as line 5 to the load 4, is mounted at the other end of the housing in one of the walls such as the bottom wall 7. These terminal fittings 17 and 18 are each offset from the longitudinal centerline of the housing 6, so that their inner conductors 19 and 20 are in line with connectors mounted on the center conductors of the outer coaxial line elements, as described later.

The filter unit shown is designed to provide a passband of from about 200 to about 400 megacycles per second with sharp cut-off and maximum attenuation above cut-off. The equivalent lumped constant circuit is shown in FIGURE 4, with broken lines indicating the sections of the circuit. It comprises two half sections, indicated by A, for terminating purposes; two full sections, indicated by B, for sharp cut-off; and two "constant K" sections, indicated by C, for maximum attenuation above cut-off.

The actual elements or components employed in the filter, shown for clarity somewhat diagrammatically in FIGURE 5, and as actually constructed and used in in FIGURES 1, 2, and 3, comprise two end termination, series resonant, shunt coaxial line elements 21 and 22 of quarter wave length, corresponding generally to elements 21′ and 22′ of the half sections A of the lumped constant circuit of FIGURE 4; two higher capacity series resonant shunt coaxial line elements 23 and 24 corresponding generally to elements 23′ and 24′ of full sections B of the lumped constant circuit of FIGURE 4; two capacitors 25 and 26 corresponding generally to capacitor elements 25′ and 26′ of the "constant K" sections C of the circuit of FIGURE 4; two end coils 27 and 28 corresponding generally to the inductors or coils 27′ and 28′; and intermediate series coils 29, 30 and 31, generally corresponding to inductors or coils 29′, 30′, and 31′ of the lumped constant circuit of FIGURE 4.

These actual components are electrically connected as shown in FIGURES 1 and 5. The end of the inner conductor 19 of the coaxial input terminal fitting 17, and the end of the inner conductor 20 of the coaxial output terminal fitting 18 are electrically connected by a conductor insulated from the housing and generally indicated by numeral 32, which includes in series the coils 27, 29, 30, 31, and 28. The center conductor of the coaxial line element 21 is connected to the conductor 32 between the inner conductor 19 of the input fitting 17 and the coil 27; the center conductor of the coaxial line element 23 is connected to the conductor 32 between the coils 27 and 29; the capacitors 25 and 26 are respectively connected to the conductor 32 between the coils 29 and 30, and 30 and 31, one terminal of each capacitor being so connected; the central conductor of the coaxial line element 24 is connected to the conductor 32 between the coils 31 and 28; and the center conductor of the coaxial line element 22 is connected to the conductor 32 between the coil 28 and the inner conductor 20 of the output terminal fitting 18. The outer conductors of the terminal fittings 19 and 18 and the coaxial line elements 21, 22, 23, and 24, and the other terminals of the capacitors 25 and 26, are electrically grounded to the housing 6.

Figure 9:
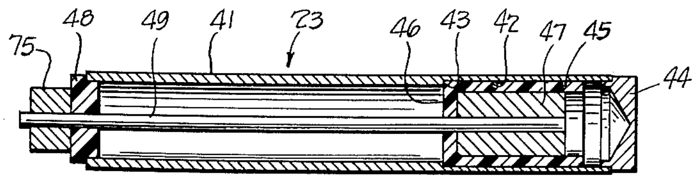
FIGURE 9 is a sectional elevation to the same scale, of one of the full section series resonant shunt coaxial line elements.

The elements 23, 24 are identical and comprise series resonant open stub coaxial lines, being shown in longitudinal section in FIG. 9. Each comprises an elongated cylindrical electrically conductive outer brass tube 41 having at one end a counterbore 42 providing a radial shoulder 43. A cylindrical insulating cup 45 formed of a suitable dielectric material such as polytetrafluoroethylene is positioned in the counterbore 42 with closed end 46 of the insulating cup located against the shoulder 43. The counterbored end of the tube 41 is closed by a brass cap 44 soldered in place after the internal parts have been assembled in the tube.

Cylindrical metal member 47, of brass and having a central axial bore, is tightly fitted within the cup 45 with one end against the bottom 46 and constitutes one plate or electrode of a coaxial capacitor located adjacent the closed end of the coaxial line element. The other plate or electrode of such capacitor is the outer tube 41.

The other or electrically open end of the tube 41 is closed by a shouldered insulator disc 48 formed of solid material having suitably dielectric properties, such as polytetrafluoroethylene; this insulator supports and has a central opening through which extends one end of a straight brass rod or wire constituting central conductor 49 of the coaxial line element. The other end of such rod conductor passes through an opening in the end wall of the dielectric cup 45 and into the bore or axial opening of the cylindrical member 47 into which it is soldered. Outside the insulator 48 the center conductor 49 is received through a bore in a brass terminal 75 in the form of a cylinder, the latter being soldered onto the conductor 49 leaving a portion of the conductor projecting for connection thereto of other circuit elements.

The coaxial line elements 23, 24 are thus composite coaxial lines each comprising a major portion with an air dielectric providing a relatively high $Z_0$ for inductance, and a minor portion with a solid dielectric and enlarged central conductor portion providing a relatively low $Z_0$ for capacity. The enlarged conductor portion 47 is from one fifth to one third, and is shown as approximately one fourth, of the total length of the central conductor disposed within the outer tube 41. The two portions are in series and the coaxial line open stub is proportioned to provide series resonance above the cut-off frequency and high resistance to arcing even at high altitudes reached in aircraft work. The elements 23, 24 are approximately quarter wave resonant open coaxial line stubs with reference to the frequency selected in achieving the required $m$ in relation to the design cut-off frequency. The composite coaxial line element provides the desired inductive and capacitative characteristics in a relatively short physical length, permitting complete enclosure within the housing and thereby achieving a compact assembly without waste space and of minimum size and weight, relatively low in cost.

The electrical length of the open line stubs 23, 24 is dependent upon the resonant frequency for the $m$ desired in the filter. In the device shown the elements 23, 24 constitute the shunt legs of the filter T's and to obtain cut-off at a frequency of approximately 400 megacycles per second these quarter wave coaxial line elements are designed for resonance at a frequency of about 500 megacycles per second, the electrical length being dependent, as is well known, upon the resonant frequency selected to obtain the desired $m$. The present design, with the coaxial open stub loaded by the capacitor portion 47, achieves the desired electrical length or effect in a relatively short physical length. In the illustrated example, the elements 23, 24 are only about half the physical length of conventional open stub lines having equivalent electrical properties for filter purposes.

Figure 8:
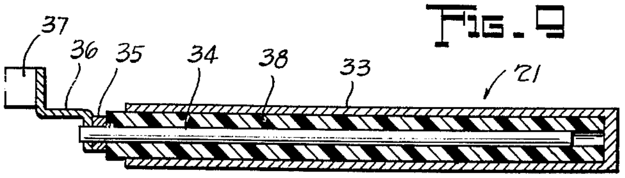
FIGURE 8 is a sectional elevation, to the same scale as FIGURE 6, of one of the end termination series resonant shunt coaxial line elements.

The series resonant coaxial elements 21 and 22 are identical to one another and are of the structure shown in longitudinal cross section in FIGURE 8. These elements are open stub coaxial transmission lines; each comprises an elongated cylindrical closed end electrically conductive outer tube 33, preferably of brass, which constitutes the outer conductor. Central conductor 34 of each such coaxial line element is also preferably of brass, having soldered to it outside the open end of the tube a brass spacer 35 and a terminal or fork connector bracket 36, also of brass, with spaced flanges 37 adapted to fit over or embrace and be soldered to the central connector of one of the coaxial terminal fittings 17 and 18. The dielectric material is polytetrafluoroethylene in the form of a sleeve 38 which supports the central conductor 34, reduces the length of the line by $$\frac{1}{\sqrt{e}}$$

and hence reduces the physical length of the coaxial line element, and increases voltage breakdown, all with a very small loss in "Q." Other suitable solid dielectric materials may be used.

The series resonant open coaxial line elements 21, 22 are each the shunt leg of one half a $\pi$ section of the filter. They constitute terminations and are designed for resonance at twice the frequency of the resonant frequency of the coaxial line elements 23, 24; the elements 21, 22 are thus designed for resonance at about 1,000 megacycles in the example given.

Figure 10:
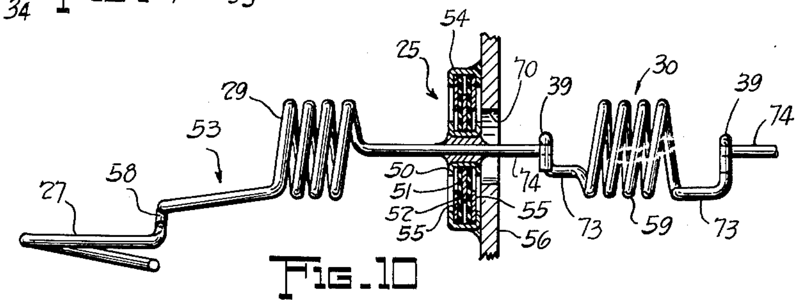
FIGURE 10 is a detail sectional elevation, along line 10—10 of FIGURE 6, of a portion of one of the partitions carrying a capacitor at a window in the partition.

The capacitors 25 and 26, which are identical are preferably of the button mica feed through type, as shown in the illustrated filter and to particular advantage in the cross section of FIGURE 10. A central metal hub or eyelet member 50 constituting one terminal of each such condenser and carrying circular mica dielectrics 51 and plate member 52 is fixed, as by soldering, to that one of the preformed wire members 53, 57 with which it is associated, at a point beyond the corresponding one of the coils 29, 31, the eyelet having a central opening through which wire is slidingly received in assembly. Outer flanged metal annular member or ring 54, also supporting the mica dielectrics 51 and plate members 55 and constituting the other terminal of the capacitor is fixed, as by soldering, to one of two transverse partition elements 56 fixed to the housing 6.

Figure 6:
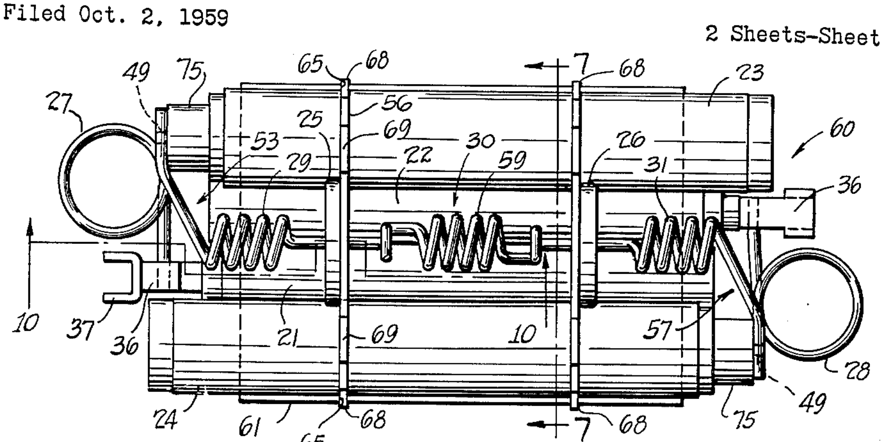
FIGURE 6 is a plan elevation to a scale larger than that of FIGURE 1, of a preassembly of the filter of FIGURE 1, showing the elements as assembled with the cradle prior to installation into a housing.

As is apparent from FIGURES 1, 3, and 6, the connector 36 of the coaxial line element tube 22, the central conductor 49 of the coaxial line element 24 and the hub member 50 of the capacitor 26 are all physically and electrically connected together by and soldered to a unitary preformed wire member 57; this wire member includes the coils 28 and 31 and, intermediate such coils, an open loop 58 which embraces the terminal end of the central conductor 49 of the tube 24 in a frictional grip to be located and held thereby in initial assembly and to which it is subsequently soldered. A similar unitary preformed wire member 53 connects and is soldered to the central conductors of the coaxial line elements 21, 23, and the capacitor 25, and is formed into the coils 27 and 29. The central coil 30 comprises a separate preformed wire member 59 having axially extending integral end portions 73 provided with looped ends 39 constituting gripping rings which in initial assembly locatingly and frictionally hold and are subsequently connected as by soldering to the aligned axially projecting end portions 74 of the wire members 53 and 57 projecting through the eyelets of the capacitors 25 and 26.

The wires of members 53, 57 and 59 of which the coils are formed are of sufficiently large cross sections to prevent overheating at the power levels involved. Preferably the wires are of copper, and silver clad or silver plated to reduce skin effects, $I^2R$ losses.

The components are disposed and located in a unique relation to each other, which provides numerous advantages. As is shown in FIGURES 1, 2, 3, 6, and 7, the coaxial line elements are arranged in parallel, overlapping relation, with the input ends of the elements 21 and 23 extending toward the input terminal fitting 17 and with the input ends of the elements 22 and 24 extending in the opposite direction toward the outlet terminal fitting 18. Moreover, the coaxial line elements are alternately disposed or interfingered in that the elements of each related set of elements 21 and 23, or 22 and 24, are separated by one of the oppositely directed elements of the other set, so that the input ends of adjacent coaxial line elements extend in opposite directions. The smaller and thinner adjacent coaxial line elements 21 and 22 of the terminating portions of the circuit are centrally disposed, adjacent and longitudinally contacting each other, and the larger and thicker coaxial line element tubes 23 and 24 of the full sections of the circuit are peripherally disposed adjacent and outside of the elements 21 and 22, but longitudinally contacting the latter, with their axes in a plane offset from the plane of the axes of elements 21 and 22 as is apparent from FIGURES 3 and 7. This offset arrangement provides in effect a longitudinal space or valley located wholly within the profile of the group of coaxial elements, in which the series coils 29, 30, and 31 and the capacitors 25 and 26 may be located in an exceedingly compact relation.

As one aspect of the invention, the filter includes partition means which divides the space inside the housing 6 into several compartments, which electrically shields and isolates the filter components or portions thereof located in one of the compartments from such components located in others of the compartments. Preferably the capacitors, which are of the button feed through type, are carried by the partition means and themselves support some or all of the coils. The partition means constitutes two flat metal partition elements 56 which divide the interior of the housing 6 into three compartments; each end compartment contains a terminal fitting, the open input ends of the coaxial line elements of a set, and two inductance coils connected in series. The partition elements 56 rigidly support the button type capacitors with one electrode of each capacitor electrically grounded to the partition, and with the wire members 53 and 57 and the coils 29, 30, and 31 also firmly supported thereby.

The coil 27 is disposed with its axis in a plane normal to the planes in which lie the axis of the coil 29, the axis of the coaxial line element 23 at the input end of which the coil 27 is located, and the axis of the coaxial line element 21. Such transverse relationship of the axis of the coil 27 to the axes of the coil 29 and the coaxial elements 21 and 23 greatly reduces or eliminates coupling between such coil 27 and these components in the compartment at the input end of the filter. In the compartment at the output end of the filter, a similar transverse or right angle relationship of the axis of the coil 28 to the axes of the coil 31 and the coaxial elements 22 and 24 similarly reduces coupling between these components.

Figure 7:
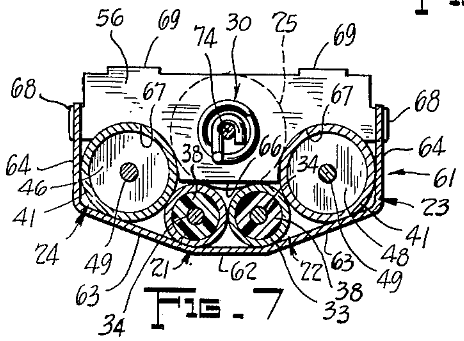
FIGURE 7 is a sectionaal elevation along line 7—7 of FIGURE 6.
Figure 11:
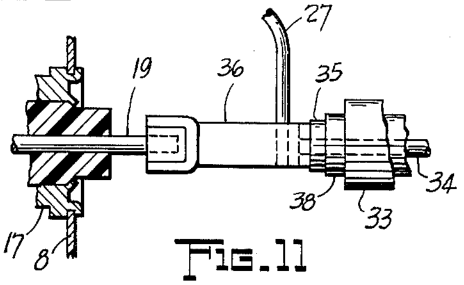
FIGURE 11 is a detail sectional elevation along line 11—11 of FIGURE 2, showing one of the end connections of the preassembly to one of the terminals of the filter.

For convenience in manufacturing, the housing 6 and the input and output terminals 17 and 18 are preassembled together. As shown in FIGURES 6 and 7, the remaining components are also preassembled into a unit 60 which comprises a sheet metal tube-supporting trough or cradle member 61 formed with a narrow flat central bottom portion 62, two adjacent upwardly slanting or oblique side bottom portions 63, and two side wall portions 64. Preferably the side wall portions have equally spaced slots 65 so positioned in pairs that each pair of slots in opposite side walls 64 is adapted to receive the ends of and to locate one of the partition elements 56. Each partition element 56 has a flat lower central edge 66 which bears against the outer tubes of the centrally disposed coaxial line elements 21 and 22 to locate them securely against the center and side portions 62 and 63 of the bottom of tube supporting cradle member 61; each such partition element also has arcuate edges 67 defining recesses beyond the ends of the lower edge 66 and at its sides to abut against the outer tubes of the peripheral coaxial line elements 23 and 24 to hold them firmly against both the oblique side portions 63 and the side walls 64 of the cradle 61. Along each side edge, each partition element 56 is also preferably formed with a lug 68 adapted to fit into and through a corresponding slot 65 in a side wall of the tube supporting cradle member 61, and also adapted to fit into a slot in the housing 6 as will later be described. Advantageously, two spaced lugs 69 are also formed along the top edge of each partition element for use in locating and connecting the lid 14, as later described.

A circular opening 70, constituting a window, is centrally located in the upper portion of each of the partition elements 56. These windows provide clearance for the wire 53, 57 projecting through the capacitor 25, 26 supported by the partitions.

In manufacture, the outer annular terminal member or ring 54 of each capacitor may be soft soldered to the partition around and concentric to the window 70 of its corresponding partition element 56. The outer tubes of the two sets of coaxial line elements 21 and 23 and 22 and 24 and the partition elements may be jig-positioned in the cradle 61, with the tubes clamped between the cradle member 61 and the partition elements 56, as described above. The parts are silver soldered together at the junctures of the tubes with the partition elements and the side walls; also at the junctures of the partition elements and side walls of the cradle member 61. The interior parts may then be inserted into the tubes of the coaxial line elements, before or after soldering the preformed wires 53 and 57, as required. The axially extending portions of the wire members 53 and 57 can then be soft soldered to the eyelets 50 of the corresponding capacitors 25 and 26, and to the loops 39 of the wire 59 comprising the coil 30.

The cradle preassembly 60, which at this stage is shown by FIGURES 6 and 7, is then inserted as a unit into the housing 6. The portions of the lugs 68 projecting through the slots in the side walls 64 of the cradle assembly snap into cooperating slots 71 in the side walls 10 and 11 of the housing 6 and hold firmly the cradle preassembly 60 in the housing 6. Solder is applied at the junctures of the central conductor ends 19 and 20 of the input and output terminal fittings and the spaced flanges 37 of the fork connector brackets 36 of the coaxial line elements 21 and 22. The bottom and side walls of the housing 6 may have openings such as slots 72 to facilitate soldering in place of the cradle preassembly and removal of the preassembly, if desired, for inspection, testing or repair.

The lid 14 is placed across the open top of the housing 6, the slots 16 in the lid receiving the lugs 69 of the partition elements 56 and the underside of the lid engaging the top edges of the partition to aid in locating and supporting the lid for soldering.

It is apparent from the above that the present arrangement comprising the preassembly of the housing and the terminal fittings on the one hand, and the preassembly of the cradle with the other parts on the other hand, provide many substantial and practical advantages in manufacture. By use of the cradle preassembly 60, all component assembly work is done outside of the housing 6 so that all portions of the small components are well exposed or readily accessible for rapid assembly and soldering at low cost. After installation of the cradle preassembly and before closure by the lid 14 the open top of the housing permits slight trimming or adjustment of the coils or other components to compensate for manufacturing tolerances. These advantages in manufacture are provided even though the filter components are small and compactly arranged.

Thus the present arrangement of the coaxial line elements in parallel and offset relation, with the thinner elements in the center and below, with the thicker elements higher and at the sides, with the outer tubes of such elements contacting adjacent tubes and alternate elements oppositely disposed, provides a valley in which the coils 29, 30, and 31, and their associated capacitors 25 and 26 may be located with no waste space; the positioning of the input and output terminal fittings offset from the centerline of the housing 6 makes it possible to connect them by short, straight connectors to the input ends of the coaxial line elements 21 and 22 at the ends of the circuit, and also provides recesses in which the end coils 27 and 28 are located in the previously described transverse relation. The coaxial line elements satisfy circuit requirements and yet have minimum physical length and diameter so as to be located wholly within the housing.

The partition elements 56, as previously indicated, aid in holding the outer tubes of the coaxial line element tubes in the cradle 61, support the capacitors 25 and 26 and the coils 29, 30, and 31, locate and secure the lid 14, and lock the cradle preassembly in the housing 6. Furthermore, the partition elements 56, in combination with the button mica feed through capacitors 25 and 26 disposed across window openings 70 in the partition elements, isolate and shield sections of the filter from each other. Thus the input ends of one pair of associated coaxial line elements 21 and 23, coils 27 and 29 and the input terminal fitting 17 of the filter are located in one shielded and isolated compartment at one end of the housing 6. Within the compartment these components are arranged with the axis of the coil 27 transverse to the axes of components 21, 23, and 29, to reduce coupling in the compartment. The input ends of the other pair of associated coaxial line elements 22 and 24, coils 28 and 31 and output terminal fitting 18 are located at the other end of the housing 6 in another isolated and shielded compartment in which the coil 28 is disposed with its axis transverse to the axes of components 22, 24, and 31 to reduce coupling. The coil 30 is disposed in a centrally located, isolated and shielded compartment between and separating the end compartments. These structural features all cooperate to reduce very substantially or eliminate completely coupling, leakage, crosstalk and other undesired reactions between the components of the filter.

The type of construction described above not only makes possible reduced size and weight at low manufacturing costs, and substantial reduction or elimination of undesired intereffects between different components of the filter, but also results in lower pass band insertion loss, lower voltage standing wave ratio, and higher stop or reject band attenuation, thus resulting in high performance efficiency.

It will be appreciated that the invention may be embodied in forms other than that specifically disclosed herein, which is given by way of example only. The essential combinations, features and characteristics of the invention are set forth in the appended claims.

What is claimed and desired to obtain by United States Letters Patent is:

1. A high frequency electrical filter comprising a conductive hollow housing, conductive partition means within and dividing the interior of the housing into a plurality of compartments shielded electrically from one another, a plurality of coaxial line elements, each line element comprising an elongated cylindrical conductive tube fast and electrically connected to the housing, each tube having an open end and the open ends of different tubes being disposed in different compartments, a center conductor in each of the line element tubes, means supporting the center conductors in insulated coaxial relation in their respective tubes, said center conductors having terminal ends projecting into the compartments through the open tube ends, coaxial electrical terminal fittings carried by the housing, each such fitting having an outer conductor electrically connected to the housing and an inner conductor insulated from the housing, the inner conductors of the different fittings projecting into different ones of the compartments, and means extending in insulated relation through the housing and the partition means electrically connecting the inner conductors of the fittings and having electrical connection with the center conductors.

2. A filter as claimed in claim 1 in which the partition means is formed with a window opening, a capacitor structure comprising an outer ring terminal and a center eyelet terminal disposed across such opening, and the last mentioned electrical connecting means extending through and electrically connected to the eyelet.

3. A filter as claimed in claim 1 in which the last mentioned electrical connecting means comprises a plurality of series connected conductive coils disposed in different ones of the compartments and shielded from one another by the partition means.

4. A filter as claimed in claim 1 in which the partition means comprises a plurality of flat metal partition elements disposed in generally parallel spaced relation to one another and delineating end compartments separated by an intermediate compartment, the open ends of the tubes being disposed in the end compartments, and the last mentioned electrical connecting means comprising a conductive coil disposed in the intermediate compartment and shielded by the spaced partition elements from leakage currents in the end compartments.

5. A filter as claimed in claim 4 in which each partition element is formed with an opening, a capacitor structure comprising outer ring and center eyelet terminals is disposed across each partition opening, and the connecting means to the conductive coil extends through and is supported by and electrically connected to the center eyelets of the capacitor structures.

6. A filter as claimed in claim 1 in which the last mentioned electrical connecting means comprises a single piece of wire formed into separate helical coils having their axes in planes normal to one another, said single wire coils being disposed in the same compartment and the wire including a juncture between the coils secured to one of the center conductor terminals in the provision of a direct electrical connection to one of the line elements and physical support for the coils.

7. A filter as claimed in claim 1 in which the partition means comprises a plurality of flat metal partition elements disposed in generally parallel spaced relation to one another and delineating end compartments separated by an intermediate compartment, the open ends of the tubes being disposed in the end compartments, and the last mentioned electrical connecting means comprising a plurality of single wire coils disposed in different compartments, each partition element being formed with an opening, a capacitor structure comprising outer ring and center eyelet terminals disposed across each partition opening, and certain of the wire coils having integral connecting portions extending through and electrically connected to the eyelets of the capacitor structures.

8. A high frequency electrical filter comprising an elongated housing of conductive material, partition means of conductive material within and dividing the interior of the housing into a plurality of compartments shielded electrically from one another, a plurality of cylindrical tubes extending transverse to the partition means and disposed in generally parallel relation to one another, each tube having a closed end in one and an open end in another of the compartments with the closed end of one tube being in the same compartment as the open end of another tube, a center conductor in and supported in insulated relation to each tube and constituting therewith a coaxial line element, coaxial line terminal fittings carried by the housing at the ends of the latter, each such fitting having an outer conductor electrically connected to the housing and an inner conductor insulated from the housing and projecting into one of the compartments, means electrically connecting the inner conductors of the fittings to the center conductors of the line elements, and means extending in insulated relation through the housing and through the partition means electrically connecting the inner conductors of the fittings and having electrical connection with the center conductors of the line elements.

9. A filter as claimed in claim 8 in which the housing includes an end wall, the open end of one of the tubes being disposed in spaced confronting relation to such end wall, and said last mentioned electrical connecting means including a wire coil disposed in the space between the open end of the one tube and the end wall of the housing.

10. A filter comprising an elongated metallic housing; a coaxial transmission line input member at one end of said housing; a coaxial transmission line output member at the other end of said housing; a first set of elongated coaxial line elements longitudinally disposed in said housing with their input ends facing said input member; a second set of elongated coaxial line elements disposed in said housing longitudinally of said first set and with their input ends facing said output member, the coaxial line elements of each set alternating with those of said first set; partition means across said housing isolating the input ends of both sets of said coaxial line elements; and conductor means electrically connecting together said input member, the input ends of said first set of coaxial line elements, the input ends of said second set of coaxial line elements, and said output member.

11. A filter comprising a longitudinally extending metallic housing; a coaxial transmission line input member at one end of said housing, a coaxial transmission line output member at the other end of said housing; a first set of elongated coaxial line elements longitudinally disposed in said housing with their input ends facing said input member; a second set of elongated coaxial elements longitudinally disposed in said housing with their input ends facing said output member, said elements being disposed so that adjacent elements are in close proximity with peripherally located elements offset from centrally located elements to define a valley; partition means extending across said housing; at least one inductance coil located in the valley defined by said coaxial line elements and supported by said partition means; and conductor means electrically connecting said input member, coaxial line elements of said first set, coil, coaxial line elements of said second set, and output member.

12. A filter comprising an elongated metallic housing; a coaxial transmission line input member at one end of said housing, a coaxial transmission line output member at the other end of said housing; a first set of elongated coaxial line elements longitudinally disposed in said housing with their input ends facing said input member; a second set of elongated coaxial line elements longitudinally disposed in said housing with their input ends facing said output member, said elements being disposed so that adjacent elements are in close proximity with peripherally located elements offset from centrally located elements to define a valley; partition means extending across said housing; at least one capacitor located in the valley defined by said coaxial line elements and supported by said partition means; and electrical conductor means connecting said input member, coaxial line elements of said first set, capacitor, coaxial line elements of said second set, and output member.

13. A filter comprising a longitudinally extending metallic housing; a coaxial transmission line input member at one end of said housing, a coaxial transmission line output member at the other end of said housing; a first set of elongated coaxial line elements longitudinally disposed in said housing with their input ends facing said input member; a second set of elongated coaxial line elements longitudinally disposed in said housing with their input ends facing said output member, said elements being disposed so that adjacent elements are in close proximity with peripherally located elements offset from centrally located elements to define a valley; partition means extending across said housing and aiding in locating said coaxial line elements; a feed-through capacitor located in said valley and mounted on said partition means; two induction coils, one located in said valley on each side of said partition means and supported therefrom; and electrical conductor means connecting said input and output members, coaxial line elements of both sets, induction coils and capacitor.

14. A filter comprising an elongated metallic housing; a coaxial transmission line input member at one end of said housing; a coaxial transmission line output member at the other end of said housing; a first set of elongated coaxial line elements longitudinally disposed in said housing with their input ends facing said input member; a second set of elongated coaxial line elements longitudinally disposed in said housing with their input ends facing said output member; at least two spaced metallic partition elements extending across said housing into contact with the walls of said coaxial line elements and said housing; a capacitor element on each of said partition elements; and a conductor connecting said input ends of said first set of coaxial line elements, one electrode of each of said capacitors, said input ends of said second set of coaxial line elements, and said output member.

15. A filter comprising, connected in sequence, an input terminal fitting adapted to be connected to a coaxial transmission line, a first elongated coaxial line element having a central conductor by means of which the input end of said coaxial line element is connected, a first coil, a second elongated coaxial line element having a central conductor by means of which the input end of said element is connected, at least three inductance coils, two spaced capacitors having one of said three coils therebetween, a third elongated coaxial line element having a central conductor by means of which the input end of said element is connected, a last coil, a fourth elongated coaxial line element having a central conductor by means of which the input end of said element is connected, and an output terminal fitting adapted to be connected to a coaxial transmission line; an elongated metallic housing in which said first and second coaxial line elements are longitudinally disposed with their connected ends facing said input member and in which said third and fourth coaxial elements are disposed with their connected ends facing said output member; and two spaced partition elements extending across said housing, each supporting one of said capacitor elements with connections thereto extending on opposite sides of the partition, said partition elements serving to divide said chamber into three shielded compartments, each end compartment containing one of said terminal fittings, the connected input ends of a pair of said coaxial line elements, one of said first and last coils between such ends and one of said three coils connected to one of said capacitors, and the central compartment containing one of said three coils connected to said capacitors.

16. A filter comprising, connected in sequence, an input terminal fitting adapted to be connected to a coaxial transmission line, a first elongated coaxial line element having a central conductor by means of which the input end of said element is connected, a first coil, a second elongated coaxial line element having a central conductor by means of which the input end of said element is connected, at least three inductance coils, two spaced capacitors having one of said three coils therebetween, a third elongated coaxial line element having a central conductor by means of which the input end of said element is connected, a last coil, a fourth elongated coaxial line element having a central conductor by means of which the input end of said element is connected, and an output terminal fitting adapted to be connected to a coaxial transmission line; an elongated metallic housing in which said first and second coaxial line elements are disposed with their connected ends facing said input member, and said third and fourth coaxial line elements are alternately disposed to said first and second elements with their connected ends facing said output member, said four coaxial line elements being arranged with the two peripherally located elements offset from the two centrally located elements to define a valley; two spaced windowed partition elements extending across said housing, each supporting one of said capacitors across its window with a connection thereto passing through said window, said partition means and said capacitors serving to divide said chamber into three shielded compartments, each end compartment containing one of said terminal fittings, the connected input ends of a pair of said coaxial line elements, one of said first and last coils between such ends and one of said three coils connected to one of said capacitors, and a central compartment containing one of said three coils connected to said capacitors, said partition elements also serving to support said capacitors and said three coils in the valley formed by said coaxial line elements.

17. A filter pre-assembly adapted to be inserted within a metallic housing, comprising a plurality of coaxial line elements disposed in parallel relation to each other with the input ends of alternate coaxial line elements facing in opposite directions, and with the centrally located coaxial line elements offset from the peripherally located coaxial line elements to define a valley; a member having bottom and side walls supporting said coaxial line elements in said offset relation; two spaced windowed partition elements fixed to the side walls of said supporting member and serving to clamp said tubes against said supporting member; a button type feed through capacitor supported by each of said partition elements with connections thereto extending on each side of the partition element; inductance coils connected in series and rigidly supported by said capacitors, said capacitors and said coils being located in the valley formed by said tubes; and means connecting the input ends of said coaxial tubes, said capacitors and said coils.

18. A preassembly for incorporation in a high frequency electrical filter comprising a plurality of conductive tubes, each having an open end and a closed end, disposed in generally parallel, side by side, overlapping relation with the open end of at least one tube facing in one direction and located adjacent the closed end of at least one other tube and with the open end of said other tube facing in the opposite direction and located adjacent the closed end of said first mentioned tube; and conductive partition means extending transversely of said tubes intermediate said oppositely facing open ends of said tubes.

19. A preassembly for incorporation in a high frequency electrical filter comprising a plurality of conductive tubes, each having an open end and a closed end, disposed in generally parallel, side by side, overlapping relation, said tubes including one set of tubes with their open ends facing in one direction and another set of tubes with their open ends facing in an opposite direction; the tubes of said last mentioned set overlapping the tubes of said first mentioned set; and conductive partition means extending transversely of said tubes intermediate said oppositely facing open ends of said tubes.

20. A preassembly for incorporation in a high frequency electrical filter comprising a group of conductive tubes, each having an open end and a closed end, disposed in generally parallel, side by side, overlapping relation, said group of tubes including one set of tubes with their open ends facing in one direction and another set of tubes with their open ends facing in an opposite direction, the tubes of said last mentioned set overlapping the tubes of said first mentioned set for the major portions of the lengths of the tubes of both sets, the tubes of both sets being arranged to define a space extending longitudinally of and within the profile of the group of the tubes; conductive partition means extending transversely of said tubes intermediate their oppositely facing open ends; electrical circuit means extending longitudinally through said space; and means carried by said partition means supporting said circuit means in insulated relation thereto and to the tubes.

21. A preassembly for incorporation in a high frequency electrical filter comprising a group of conductive tubes, each having an open end and a closed end, disposed in generally parallel, side by side, overlapping relation, said group of tubes including one set of tubes with their open ends facing in one direction and another set of tubes with their open ends facing in an opposite direction, the tubes of said last mentioned set overlapping the tubes of said first mentioned set, the tubes of both sets being arranged to define a space extending longitudinally of and within the profile of the group of tubes; conductive partition means extending transversely of said tubes intermediate their oppositely facing open ends; and electrical circuit means extending longitudinally and in insulated relation through said space and through said partition means.

22. A preassembly for incorporation in a high frequency electrical filter comprising metal frame means including at least one transverse partition and a group of metal tubes disposed in generally parallel side by side relation to define a valley having portions on opposite sides of the partition, said partition having edge portions contoured in generally complemental relation to the profile of the tubes and abutted against the tubes intermediate and spaced from their ends, said partition also being formed with a window opening centered in the valley, and a button capacitor disposed across said opening and comprising an outer ring terminal secured and electrically connected to the partition and a central terminal centered in the opening as a support for an electrical conductor extending longitudinally in the valley.

23. A filter comprising a conductive housing; coaxial line terminal members carried by said housing; a plurality of elongated coaxial line elements longitudinally disposed in said housing in generally parallel, side by side, overlapping relation with the input end of at least one coaxial line element facing one end of said housing and with the input end of at least one other coaxial line element facing another end of said housing, said last mentioned coaxial line element overlapping said first mentioned coaxial line element; and means isolating said oppositely facing input ends of said coaxial line elements from each other.

24. A filter comprising a conductive housing; coaxial line terminal members carried by said housing; a first set of elongated coaxial line elements longitudinally disposed in said housing, said elements having input ends facing one end of said housing; a second set of elongated coaxial line elements which are longitudinally disposed in said housing in generally parallel, side by side, overlapping relation to the coaxial line elements of said first set and having input ends facing another end of said housing; and means isolating said input ends of said first set of coaxial line elements from said input ends of said second set of coaxial line elements.

25. A filter comprising a conductive housing; coaxial line terminal members carried by said housing; a group of generally parallel, elongated coaxial line elements longitudinally disposed in said housing in overlapping relation with the input end of at least one of said coaxial line elements facing one end of said housing and the input end of at least one other coaxial line element facing the other end of said housing, said coaxial line elements being arranged to define a space extending longitudinally of and within the profile of said group of said elements; means isolating said oppositely facing input ends of said coaxial line elements from each other; and electrical circuit means extending longitudinally in said space, said circuit means extending on each side of said isolating means and being connected to said terminal members and the input ends of said coaxial line elements.

26. A filter comprising a conductive housing; a first coaxial transmisison line terminal member at one end of said housing; another coaxial transmisison line terminal member at another end of said housing; a group comprising a first set of parallel elongated coaxial line elements longitudinally disposed in said housing with their input ends facing one of said terminal members, and a second set of elongated coaxial line elements longitudinally disposed in said housing in generally parallel overlapping relation to those of said first set and with their input ends facing said other terminal member, said coaxial line elements being arranged to define a space extending longitudinally of and within the profile of said group of said elements; partition means extending transversely of said coaxial line elements and isolating the oppositely extending input ends of said coaxial line elements; and electrical circuit means extending longitudinally in said space, said circuit means extending through said partition means and being connected to said terminal members and the input ends of said coaxial line elements.

27. A preassembly for incorporation in a high frequency electrical device such as a filter, said preassembly comprising an open ended metal trough having spaced confronting side walls, a plurality of cylindrical metal tubes disposed in said trough in generally parallel side by side relation, the tubes being in contact with one another, one of the tubes touching others of the tubes along parallel contact lines, a partition extending across the trough between the side walls of the trough, said partition having edge portions contoured in generally complemental relation to the profile of the tubes and abutted against the tubes intermediate and spaced from their ends, said contact lines being parallel to the side walls of the trough and disposed between the trough and said edge portions of the partition.

References Cited in the file of this patent

UNITED STATES PATENTS 2,940,058 Foster ------------------- June 7, 1960

OTHER REFERENCES

Melngailis et al.: IRE Transactions on Radio Frequency Interference, vol. RFI-1, May 1959, pages 11–17.